United States Patent
Akatsu et al.

(10) Patent No.: US 6,333,274 B2
(45) Date of Patent: *Dec. 25, 2001

(54) METHOD OF MANUFACTURING A SEMICONDUCTOR DEVICE INCLUDING A SEAMLESS SHALLOW TRENCH ISOLATION STEP

(75) Inventors: Hiroyuki Akatsu, Mohegan Lake, NY (US); Soichi Nadahara, Yokohama (JP); Takashi Nakao, Manassas, VA (US); Seiko Yoshida, Yokohama (JP)

(73) Assignees: Kabushiki Kaisha Toshiba, Kawasaki (JP); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,152

(22) Filed: Mar. 31, 1998

(51) Int. Cl.[7] .................................................. H01L 21/302
(52) U.S. Cl. ........................................ 438/745; 438/756
(58) Field of Search ............................. 438/430, 755, 438/699, 754, 745

(56) References Cited

U.S. PATENT DOCUMENTS

| | | | |
|---|---|---|---|
| H204 | 2/1987 | Oh et al. ........................ 156/648 |
| 4,222,792 | 9/1980 | Lever et al. ....................... 148/1.5 |
| 4,394,196 | 7/1983 | Iwai ................................. 148/187 |
| 4,396,460 | 8/1983 | Tamaki et al. .................. 156/653 |
| 4,528,047 | 7/1985 | Beyer et al. ..................... 148/175 |
| 4,639,288 | * | 1/1987 | Price et al. ...................... 438/739 |
| 4,656,497 | 4/1987 | Rogers et al. .................... 357/50 |
| 4,680,614 | 7/1987 | Beyer et al. ...................... 357/50 |
| 4,689,656 | 8/1987 | Silvestri et al. .................. 357/49 |
| 4,714,520 | 12/1987 | Gwozdz ........................... 437/228 |
| 4,835,115 | 5/1989 | Eklund .............................. 437/38 |
| 4,847,214 | 7/1989 | Robb et al. ....................... 437/67 |
| 5,006,482 | 4/1991 | Kerbaugh et al. ................ 437/67 |
| 5,099,304 | 3/1992 | Takemura et al. ................ 357/49 |
| 5,106,777 | 4/1992 | Rodder ............................. 437/67 |
| 5,223,736 | 6/1993 | Rodder ............................ 257/506 |
| 5,229,316 | * | 7/1993 | Lee et al. ......................... 438/430 |
| 5,244,841 | 9/1993 | Marks et al. .................... 437/228 |
| 5,306,940 | 4/1994 | Yamazaki ........................ 257/374 |
| 5,358,891 | * | 10/1994 | Tsang et al. ..................... 438/430 |
| 5,387,550 | 2/1995 | Cheffings et al. ............... 437/189 |
| 5,480,832 | * | 1/1996 | Miura et al. ..................... 438/430 |
| 5,514,832 | 5/1996 | Dusablon, Sr. et al. ......... 174/15.1 |
| 5,719,088 | * | 2/1998 | Moon et al. ..................... 438/435 |
| 5,807,782 | * | 9/1998 | Koh et al. ........................ 438/396 |
| 5,817,580 | * | 10/1998 | Violette .......................... 438/756 |

OTHER PUBLICATIONS

Wolf, Silicon Processing for the VLSI Era, vol. 2, p. 51, 1990.*

* cited by examiner

Primary Examiner—Benjamin L. Utech
Assistant Examiner—Duy-Vu Deo
(74) Attorney, Agent, or Firm—Banner & Witcoff, Ltd.

(57) ABSTRACT

A trench is formed. A first TEOS film is deposited in the trench. Thereafter, the first TEOS film is etched back by a wet etching method up to a planarized surface of a substrate. In this way, seams and a void generated during the first TEOS film deposition step are exposed. This is attained by performing the etching under the conditions that an etching rate for the TEOS film of the upper portion of the trench is larger than that for the TEOS film of the bottom portion of the trench. Thereafter, a second TEOS film is deposited in the trench.

4 Claims, 11 Drawing Sheets

METHOD OF MANUFACTURING A SEMICONDUCTOR DEVICE INCLUDING A SEAMLESS SHALLOW TRENCH ISOLATION STEP

BACKGROUND OF THE INVENTION

The present invention relates to a method of manufacturing a semiconductor device having a trench isolation, and more specifically, a method of manufacturing a semiconductor device having a trench filled with a seamless insulating film.

A memory cell of a semiconductor memory device, DRAM, is formed of a capacitor and a transfer gate. Each memory cell is isolated from others by a shallow trench filled with an insulating film. The isolation method employed herein is called "Shallow Trench Isolation".

In the DRAM, in the case where the integration level of the devices is not so high and an opening width of the shallow trench is not so narrow, the trench can be completely filled with the insulating film.

However, with the progress of miniaturization of the device, the opening width of the shallow trench becomes narrow. As a result, it becomes difficult to completely fill the trench with the insulating film. When the shallow trench has a narrow opening width, seams and a void are inevitably formed in the interface of the insulating film buried within the trench and inside the insulating film, respectively. If the seams and void are present, etching is further advanced from the seam formation region and the void is exposed by etching in a later wet-etching process using hydrofluoric acid or ammonium fluoride. Consequently, deformation will be induced and the planarization of the surface will be degraded.

Since these seams and void are filled with polysilicon deposition performed thereafter, the buried polysilicon in the seams and void remains without being removed even if CMP and RIE are applied thereafter. Consequently, short circuiting occurs between gate electrodes, decreasing the yield of the device.

A method for preventing the generation of the seams and void is disclosed in USP publication U.S. Pat No. 4,714,520. In this method, a trench is filled with an insulating film in two steps.

More specifically, a first insulating film is deposited in the trench in a thickness of 30 to 50% of the total depth thereof. After the first insulating film is etched up to 50 to 80% of the total depth, the trench is filled with a second insulating film.

However, the disclosed method employs dry etching using an etching gas such as HCl after the first insulating film is deposited. For this reason, the first insulating film remains after the dry etching in such a manner that it covers the inner-wall of the trench uniformly in almost the same thickness. As a result, the opening width of the trench becomes substantially smaller than designed. If the second insulating film is deposited in this state, the trench cannot be completely filled with the insulating film. The seams and void are inevitably generated.

BRIEF SUMMARY OF THE INVENTION

It is an object of the present invention to provide a method of manufacturing a semiconductor device capable of forming a device-isolation trench filled with an insulating film without seams and a void, thereby improving a yield of device.

Another object of the present invention is to provide a method of manufacturing a semiconductor device capable of forming a device-isolation trench filled with an insulating film without seams and a void to prevent electric short circuiting between gate electrodes, thereby preventing a decrease in a yield of the device.

According to the present invention, there is provided a method of manufacturing a semiconductor device comprising the steps of:

forming a trench in a semiconductor substrate;

depositing a first insulating film in the trench;

etching back the first insulating film by a wet-etching method; and depositing a second insulating film in the trench.

According to the present invention, there is provided a method of manufacturing a semiconductor device comprising the steps of:

forming a trench-type capacitor by forming a first trench in a semiconductor substrate;

forming a second trench in the semiconductor substrate, the second trench serving as device isolation and being shallower than the first trench;

depositing a first insulating film over the entire surface of the semiconductor substrate including the second trench so as not to fill the second trench, completely;

etching back the first insulating film by a wet-etching method;

depositing a second insulating film to fill the second trench, completely; and forming a transfer gate connected to the trench type capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, the present invention will be explained in the form of embodiments with reference to the accompanying drawings.

Figure 1A:
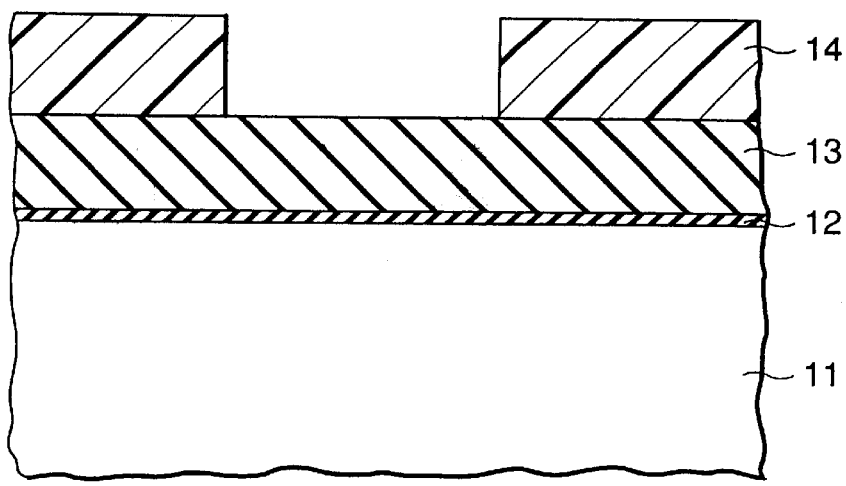
FIGS. 1A to 1E are cross-sectional views showing the steps of manufacturing a semiconductor device according to the present invention in a stepwise manner.

FIGS. 1A to 1E show STI formation steps. In the first place, as shown in FIG. 1A, a pad oxidation film ($SiO_2$) 12 and a pad nitride film ($Si_3N_4$) film 13 are successively deposited over an entire surface of a single crystalline Si semiconductor substrate 11. A photoresist film 14 is then formed and patterned so as to have an opening at a predetermined STI formation region.

Figure 1B:
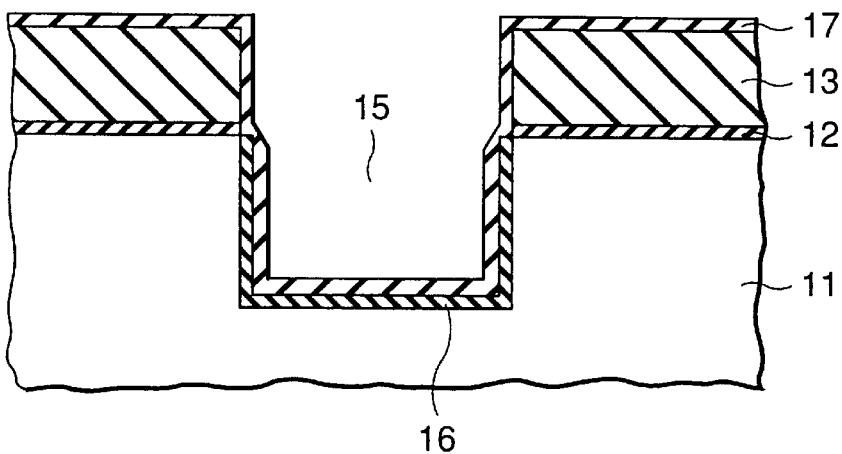

Then, as shown in FIG. 1B, the substrate 11 is etched by RIE using the photoresist film 14 as a mask. As a result, the substrate 11 is etched away in a depth of about 250 nm from the surface to form a trench 15. After the photoresist film 14 used in the etching step is removed by ashing, the resultant substrate is subjected to oxidation at 1000° C. in a dry oxidation atmosphere to remove damages by RIE, thereby forming an oxidation film ($SiO_2$) 16 (10 nm thick). Furthermore, a liner nitride film ($Si_3N_4$) 17 (about 8 nm thick) is deposited over the entire surface of the resultant substrate by LP-CVD to protect the inner wall of the trench.

Figure 1C:
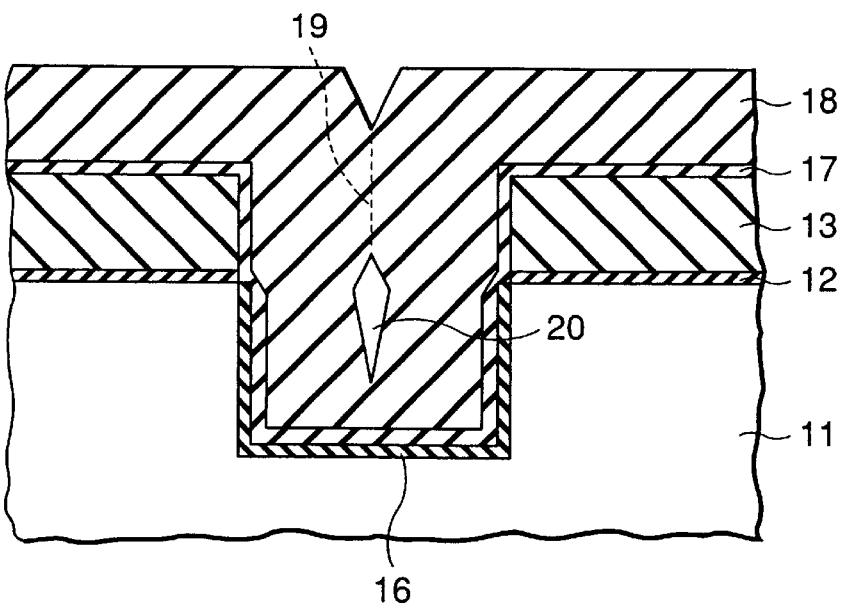

As shown in FIG. 1C, a TEOS (tetraethyl orthosilicate) film 18 (about 600 nm thick) is deposited over the entire surface by a CVD method to fill the trench 15. In the TEOS film deposition step, if the aspect ratio of the opening width 15 of the trench is small, seams 19 will appear in the interface of the TEOS film 18 and a void 20 will be formed inside the TEOS film 18, as mentioned above.

Figure 1D:
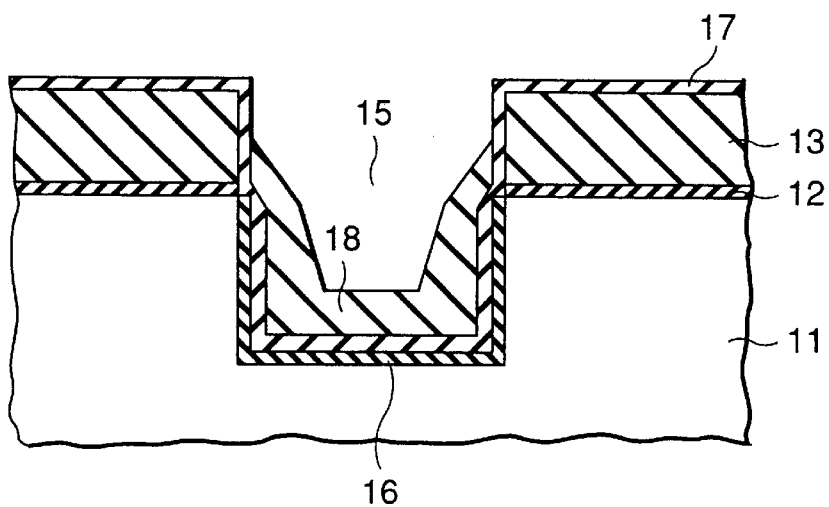

As shown in FIG. 1D, the TEOS film 18 is etched back by the wet etching using hydrofluoric acid up to the planarized surface of the substrate 11. As a result, the seams 19 and the void 20 are exposed. The TEOS film 18 is etched under such conditions that the etching rate of the TEOS film 18 of the upper portion of the trench 15 is larger than that of the bottom portion thereof. Such conditions are satisfied if the wet-etching is performed by using hydrofluoric acid. As a result of the etch back, the TEOS film 18 deposited first is left much at bottom corner portions of the trench 15 and a taper is formed on the side wall.

Figure 1E:
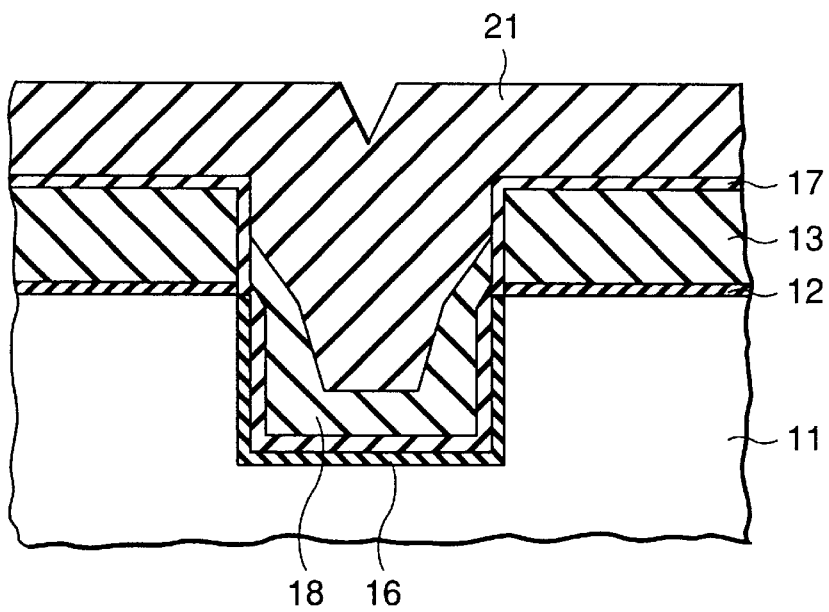

Next, as shown in FIG. 1E, a second TEOS film 21 is deposited over the entire surface by the CVD method to fill the trench 15 completely. Since the second TEOS film 21 is deposited, the TEOS film can be filled in the trench without seams and void. The resultant substrate is thereafter subjected to a planarization process and a gate-formation process.

Now, we will explain a method of manufacturing a DRAM, including the STI formation step shown in FIGS. 1A to 1E.

Figure 2A:
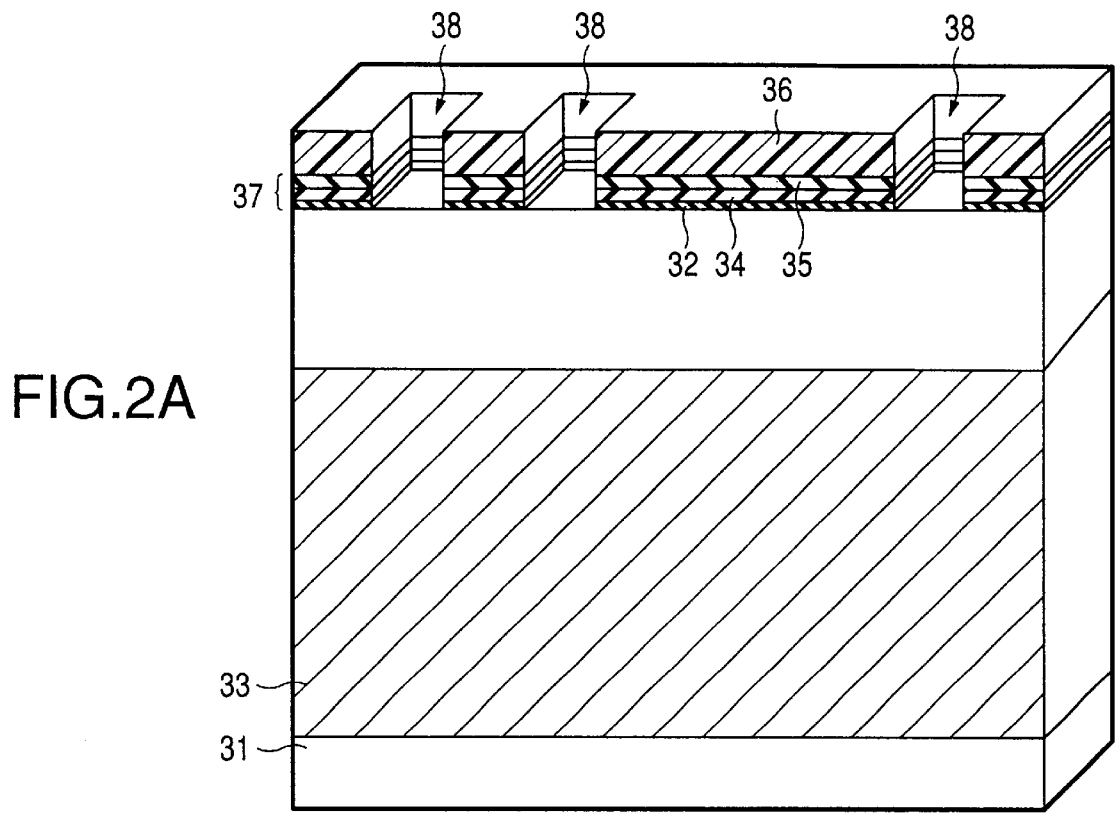
FIGS. 2A to 2R are cross sectional views showing the steps of manufacturing a DRAM, including the STI formation step shown in FIGS. 1A to 1E.

First, as shown in FIG. 2A, the surface of a p-type single-crystalline Si semiconductor substrate 31 is oxidized with heat to form a buffer oxidation film 32. Then, n-type impurity ions are injected from the surface of the substrate 31 toward the deep inside via the buffer oxide film 32. In this way, an n-type well 33 (hereinafter, referred to as "buried well") is formed. The buried well 33 is drawn out to the surface of the substrate 31 via a draw-out well (not shown). Thereafter, the silicon nitride film 34 is formed on the buffer oxidation film 32. After a silicon nitride film 35 is formed on the silicon nitride film 34, a photoresist film 36 is formed on the silicon oxide film 35. The photoresist film 36 is then selectively exposed to light using the photoresist film as a mask, and subjected to a development process to form a window at a portion of the photoresist film 36 corresponding to a cell capacitor formation region.

The stacked film 37, which consists of the buffer oxide film 32, the silicon nitride film 34 and the silicon oxide film 35, is selectively etched to form a window 38 for forming a deep trench for a cell capacitor.

Figure 2B:
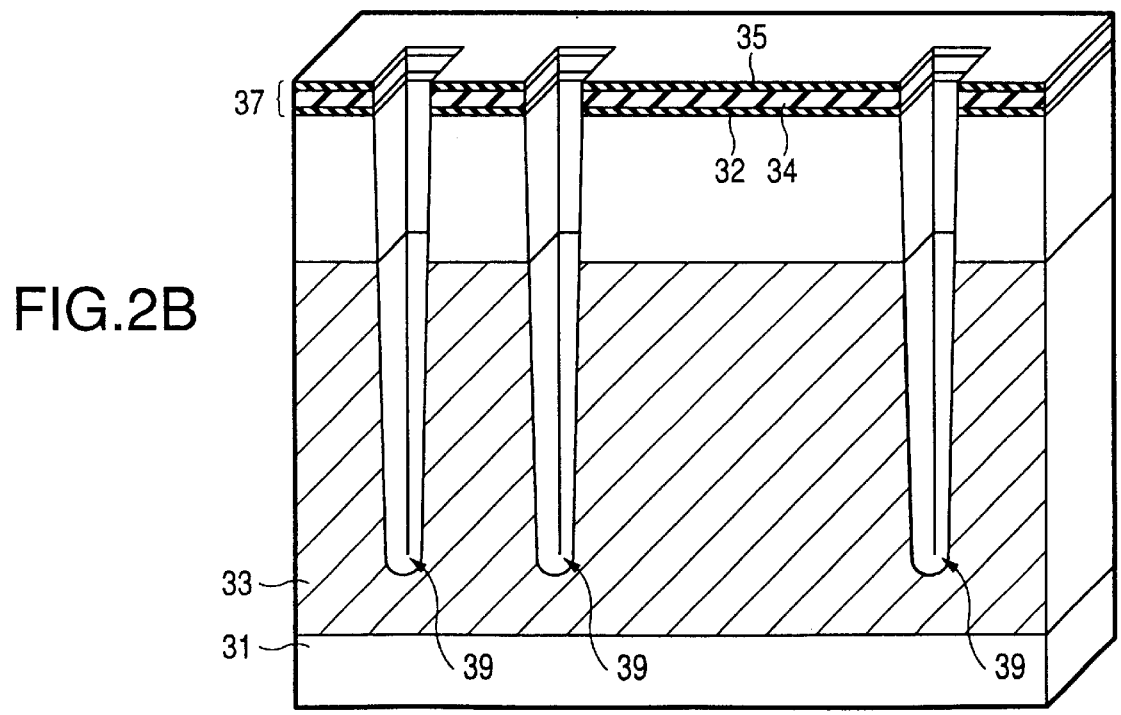

As shown in FIG. 2B, after the photoresist film 36 is removed, the substrate 31 is selectively etched by RIE using the stacked film 37 as a mask. As a result, a deep trench 39 is formed.

Figure 2C:
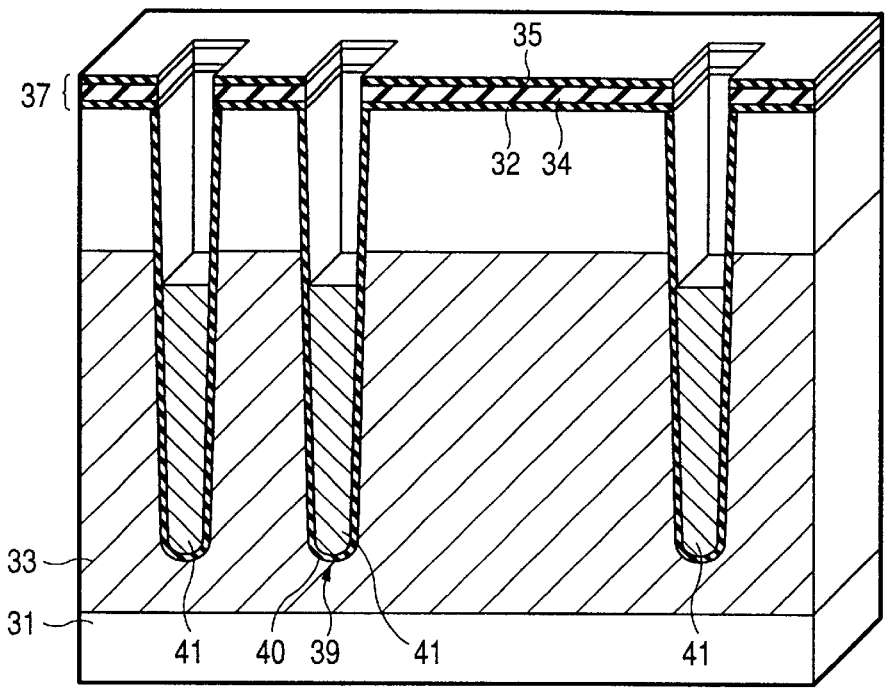

As shown in FIG. 2C, a dielectric film 40 serving as a capacitor is formed on the side wall of the deep trench 39. As an example of the dielectric film 40, a so-called ON film may be used which is formed of a silicon nitride film and an oxide film. After an n-type impurity doped polysilicon is deposited over the entire surface, the polysilicon is etched back to leave the polysilicon film 41 deep in the deep trench 39, more specifically, in the vicinity of a buried well 33.

Figure 2D:
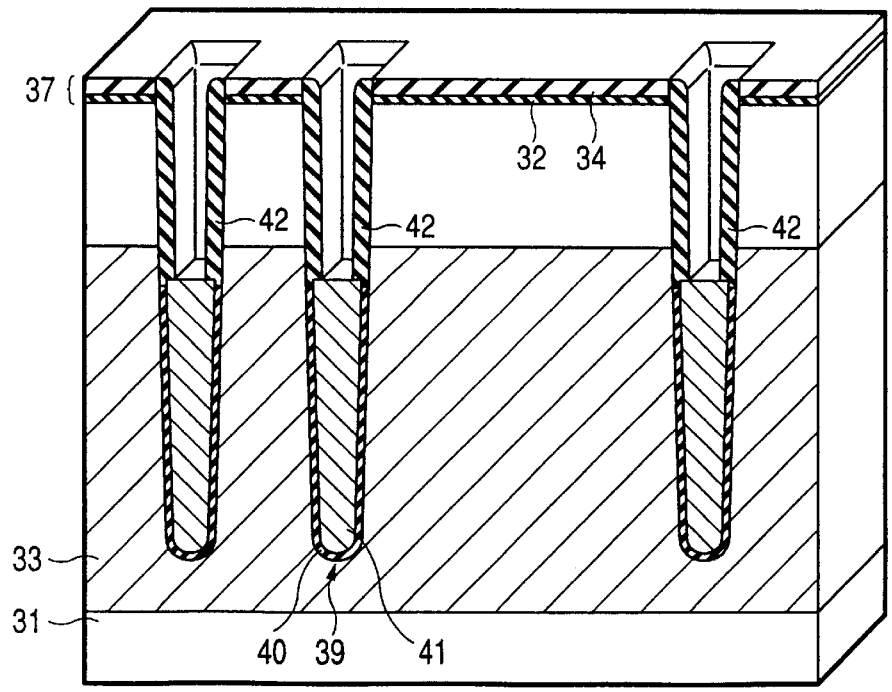

As shown in FIG. 2D, after the dielectric film 40 exposed on the upper side wall of the deep trench 39 is removed by wet etching, the silicon oxide film is deposited. The silicon oxide film is then etched away by RIE to form a silicon oxide film 42 called "collar oxide" on the upper side wall of the deep trench 39.

The stacked film 37 is etched little by little until the present step, with the result that the thickness of the film 37 is reduced. For example, in FIG. 2D, the uppermost silicon oxide film 35 is completely removed and the silicon nitride film 34 is exposed.

Figure 2E:
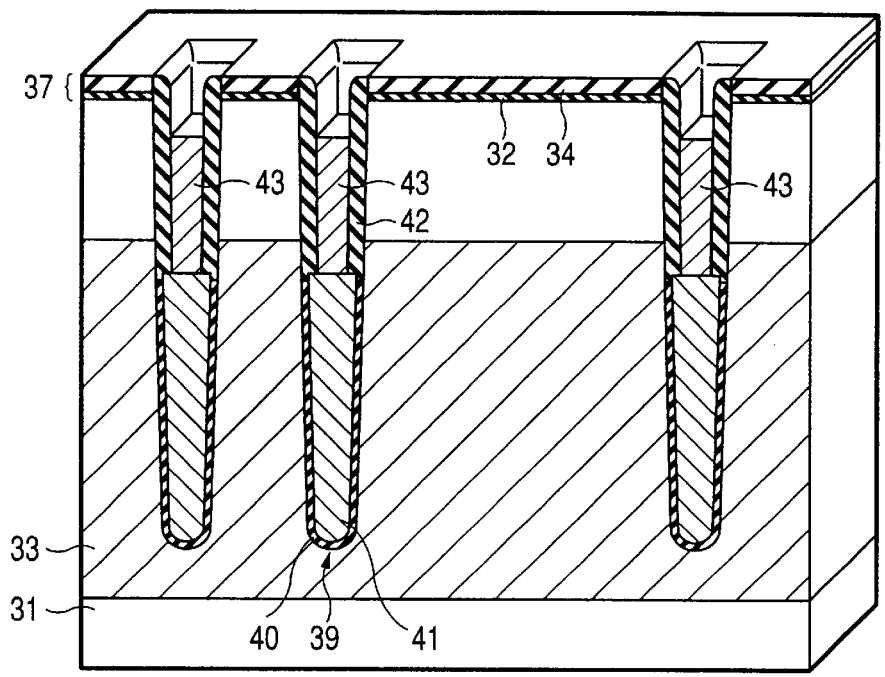

As shown in FIG. 2E, the n-type impurity doped polysilicon is deposited over the entire surface. The polysilicon is etched back to leave a polysilicon film 43 in the middle of the deep trench 39.

Figure 2F:
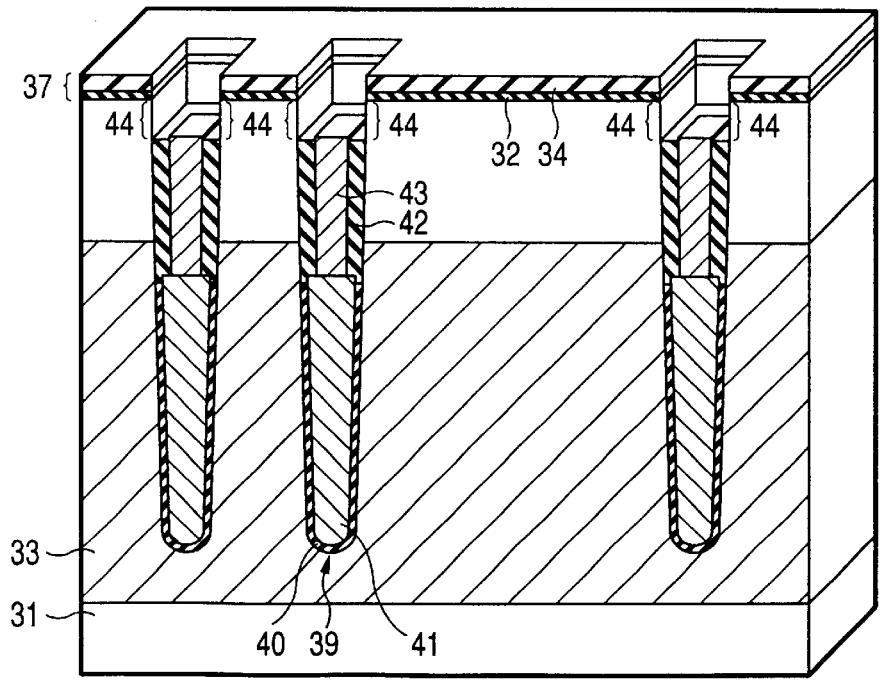

As shown in FIG. 2F, the silicon oxide (collar oxide) film 42 exposed on the upper side wall of the deep trench 39 is removed. In this way, an exposed surface 44 is formed on the side wall near the opening of the deep trench 39.

Figure 2G:
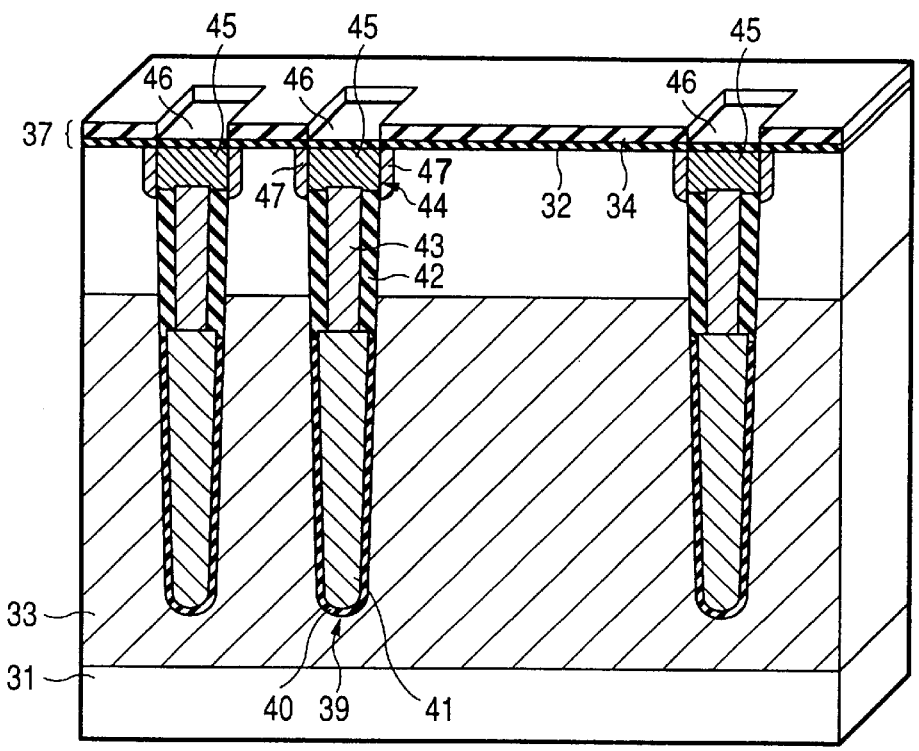

As shown in FIG. 2G, the n-type impurity doped polysilicon is deposited over the entire surface and etched back to form a polysilicon film 45 inside the deep trench 39 near the opening thereof. Subsequently, the exposed surface of the polysilicon 45 is oxidized with heat to form the silicon oxide film 46. Then, n-type impurity ions are dispersed into the substrate 31 from the surface of the polysilicon film 45 via the exposed surface 44 to form an n-type impurity dispersion region 47 (hereinafter referred to as "buried strap") near the surface of the substrate 31.

Figure 2H:
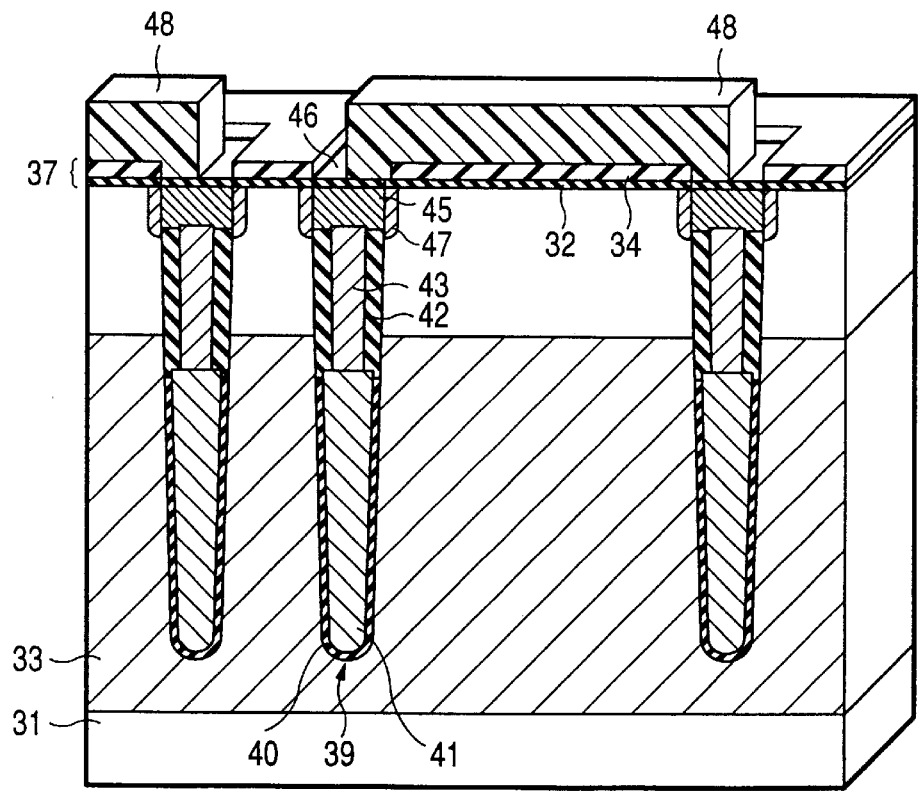

As shown in FIG. 2H, a photoresist film 48 is formed which has an opening in which the region including the upper portion of the deep trench 39 (corresponding to an element isolation region) is partly exposed.

Figure 2I:
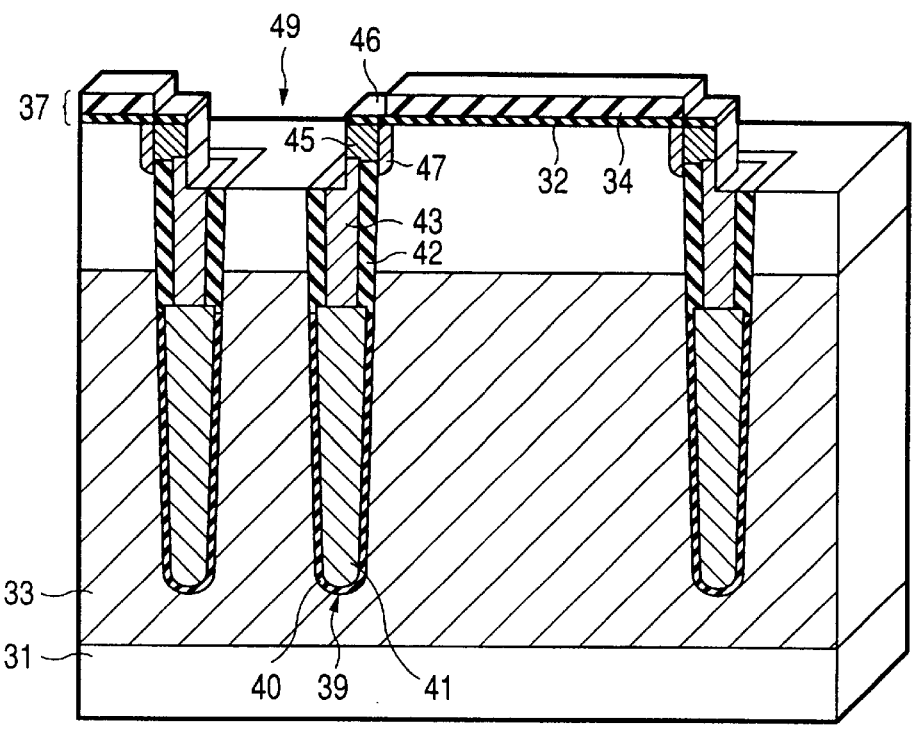

As shown in FIG. 2I, the stacked film 37, the silicon oxide film 46, the polysilicon film 45, the polysilicon film 43, the collar oxide film 42, and the substrate 31 are selectively etched by RIE using the photoresist film 48 as a mask. In this manner, a shallow trench 49 is formed. The bottom of the shallow trench 49 is positioned between the deepest portion of the buried strap 47 and the shallowest portion of the buried well 33. The depth of the shallow trench 49 is, for example, about 250 nm as measured from the surface of the substrate 31, as explained in FIG. 1B. Thereafter, the photoresist film 48 is completely removed.

Figure 2J:
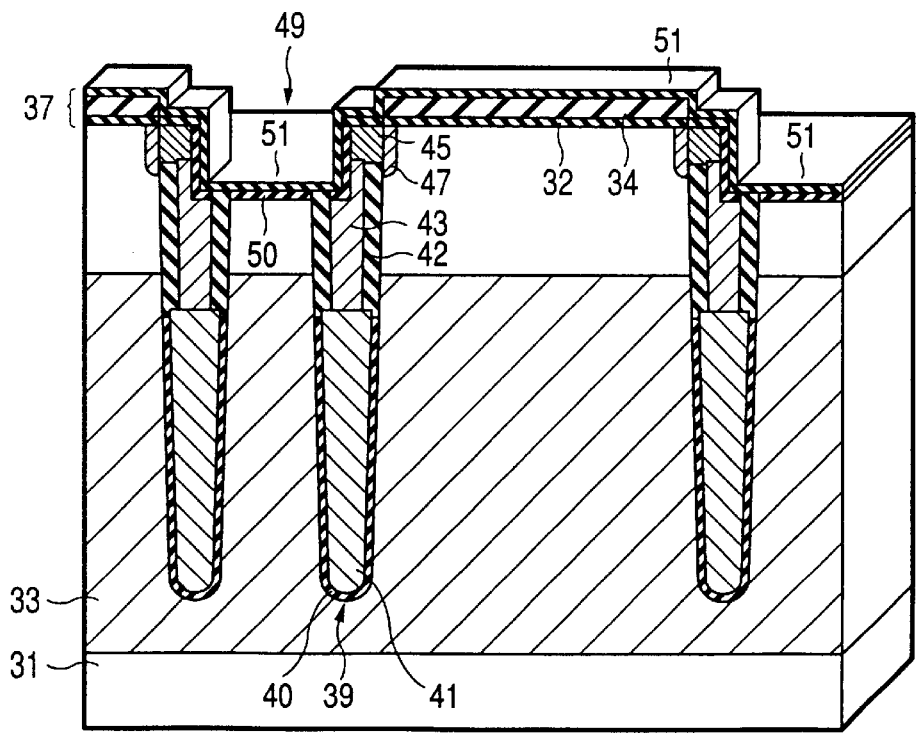

As shown in FIG. 2J, after the photoresist film 48 is removed by ashing, the substrate is oxidized in a dry oxidation atmosphere at 1000° C. to remove the damage given by RIE. As a result, a silicon oxide film 50 (STI oxidation film) of 10 nm thick is formed. Furthermore, a silicon nitride film (liner nitride film) 51 (about 8 nm thick) is formed over the entire substrate by LP-CVD to protect the inner wall of the trench.

Figure 2K:
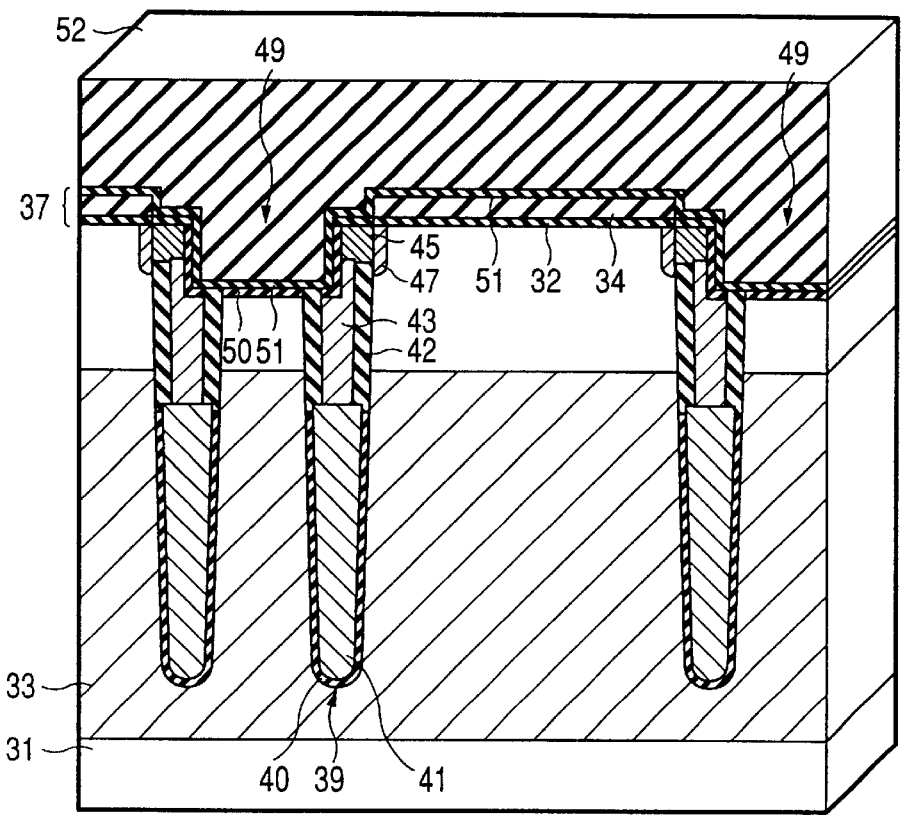

As shown in FIG. 2K, after the first TEOS film (about 600 nm thick) is deposited over the entire surface by the CVD method, the TEOS is etched back up to about the planarized plane of the substrate 31 by wet etching using a hydrofluoric acid solution. At this time, the deposited first TEOS film is partially left much at bottom corners inside the shallow trench 49 and a taper form appears in the side wall, as explained in FIG. 1D. Subsequently, the second TEOS film is deposited over the entire surface by the CVD method to form a TEOS film 52.

Figure 2L:
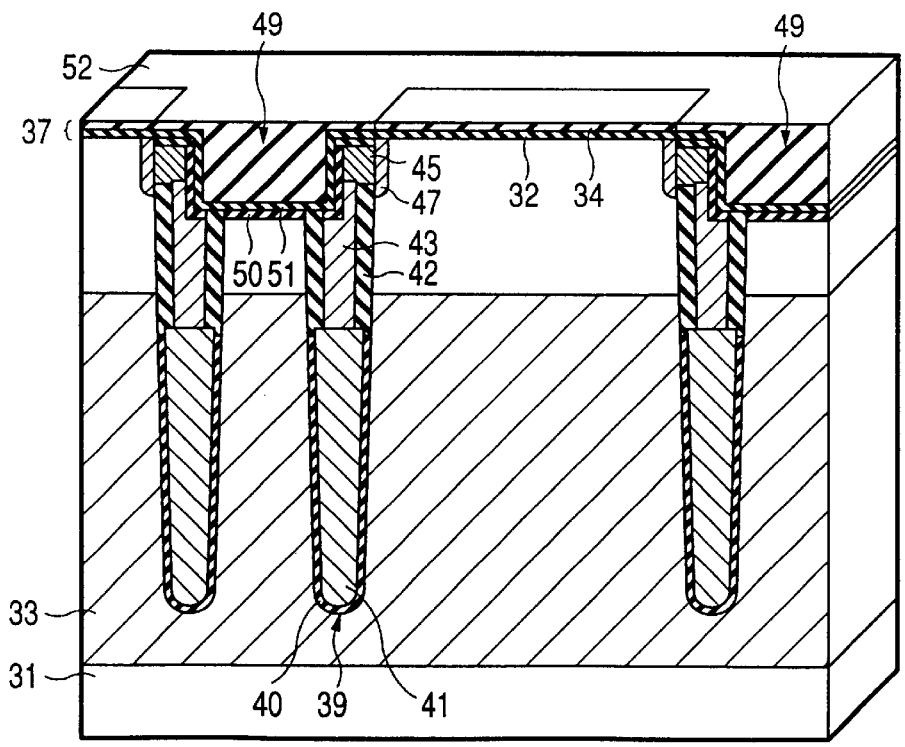

As shown in FIG. 2L, the TEOS film 52 is removed from the surface successively by CMP. Since the upper layer silicon nitride film 34 of the stacked film 37 serves as a stopper, the TEOS film 52 is left only inside the shallow trench 49.

Figure 2M:
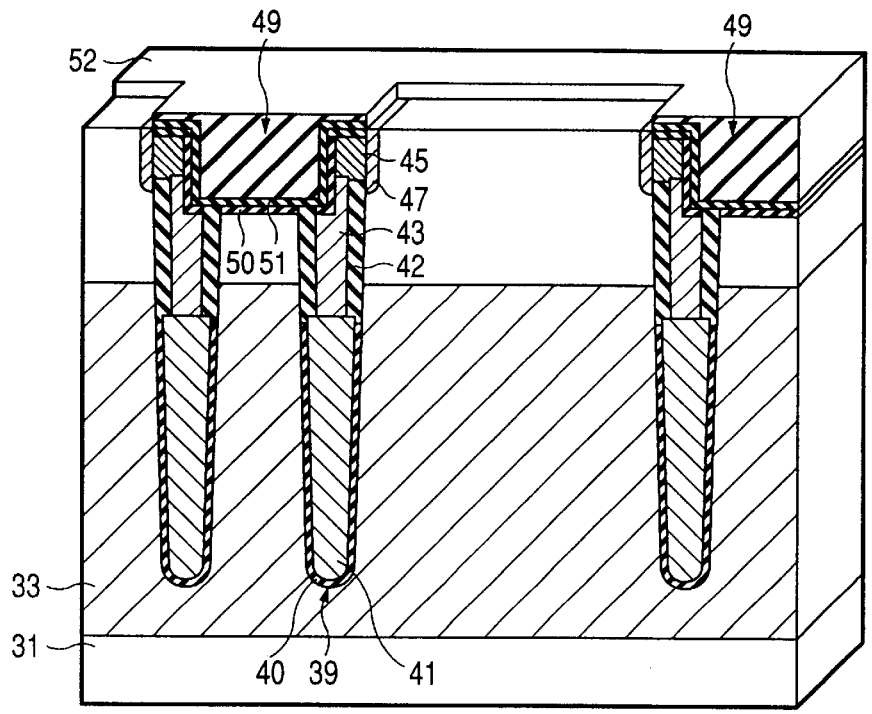

As shown in FIG. 2M, the stacked film 37 is then removed to expose the surface of the substrate 31, which corresponds to the device activation region.

Figure 2N:
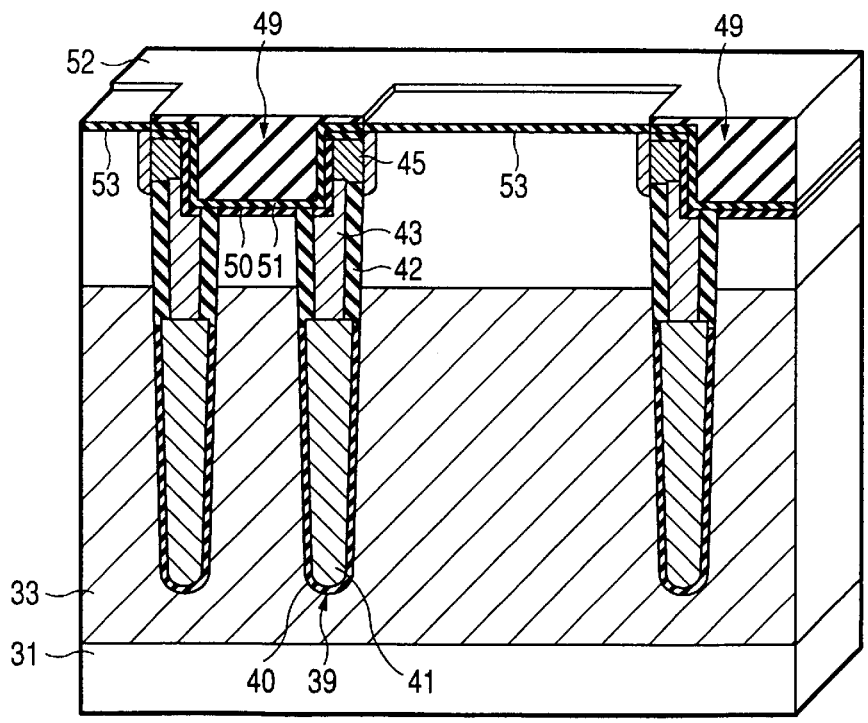

As shown in FIG. 2N, the exposed surface of the substrate 31 is oxidized with heat to form a gate oxide film 53. Before the gate oxide film 53 is formed, p- or n-type impurity ions may be injected into the substrate 31 in order to adjust a threshold voltage of a transfer gate of a memory cell or a transistor constituting a peripheral circuit to a predetermined value.

Figure 2O:
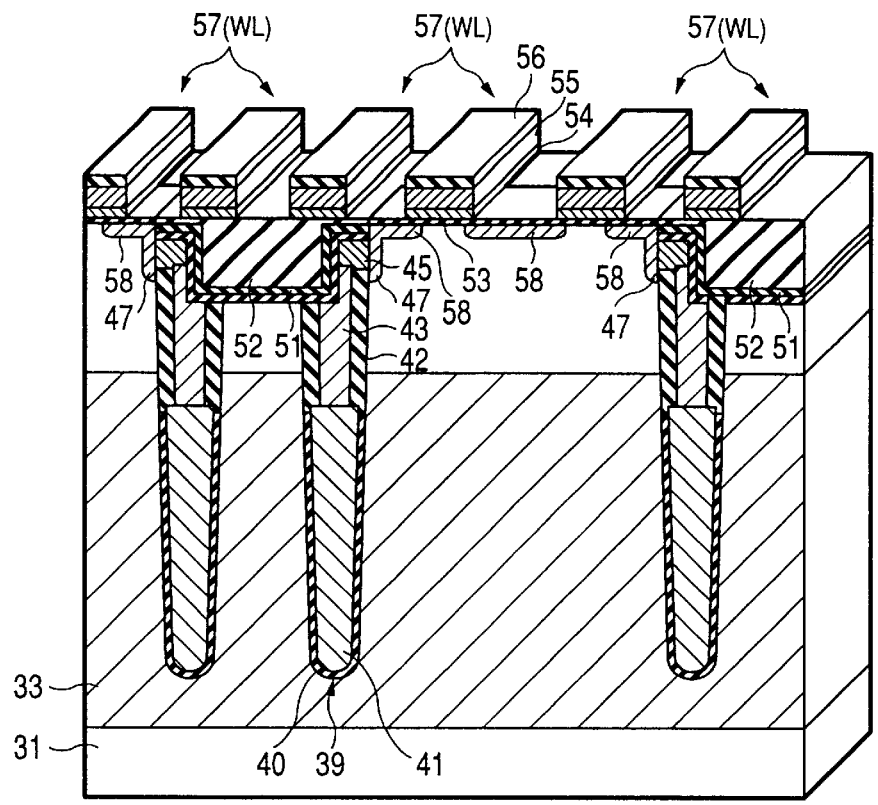

As shown in FIG. 2O, after the n-type impurity doped polysilicon film 54, a tungsten silicide film 55, and a silicon nitride film 56 are formed over the entire surface, a photoresist film (not shown) is further deposited on the resultant surface and patterned. The silicon nitride film 56, the tungsten silicide film 55 and the polysilicon film 54 are selectively etched by RIE using the patterned photoresist film as a mask to form a word line pattern 57. After the photoresist film is removed, n-type impurity ions are injected into the substrate 31 using the word line pattern 57 as a mask, thereby forming an n-type source/drain region 58. The source/drain region 58 is electrically connected to the buried strap 47.

Figure 2P:
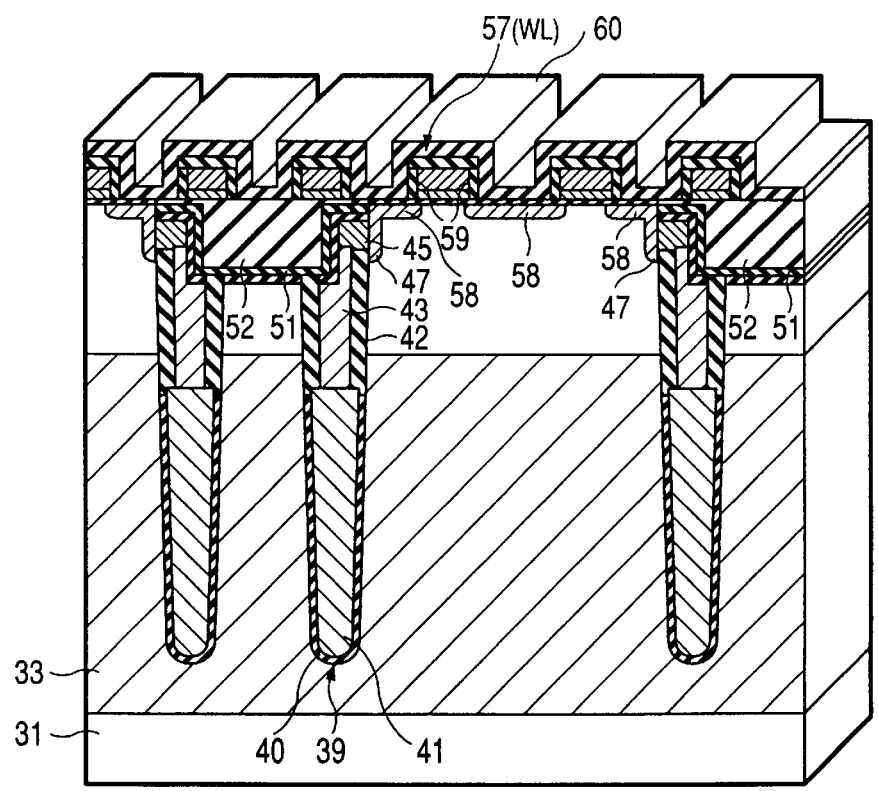

As shown in FIG. 2P, the side wall of the word line pattern 57 is oxidized with heat to form a side wall insulating film 59. Subsequently, a silicon nitride film 60 is formed over the entire surface.

An insulating film such as BPSG is then deposited over the entire surface to form a first interlayer insulating film 61. Subsequently, a photoresist film (not shown) is deposited over the interlayer insulating film 61, exposed to light, and developed, thereby patterning the photoresist film so as to form a window at a position corresponding to a contact hole.

Figure 2Q:
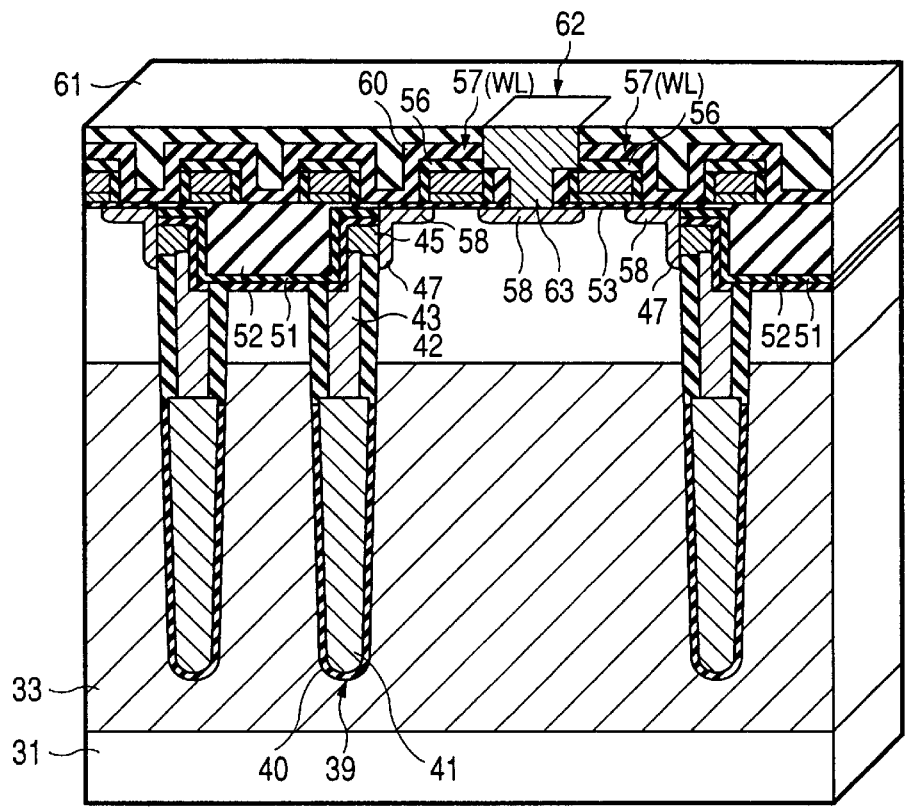

As shown in FIG. 2Q, the interlayer insulating film 61 is selectively etched by RIE using the photoresist film as a mask to form a contact hole 62 in the interlayer insulating film 61. Subsequently, an n-type impurity doped polysilicon is formed over the entire surface. The polysilicon is removed by CMP successively from the surface thereof. As a result, the polysilicon is left inside the contact hole 62, which serves as a polysilicon film (contact plug) 63 electrically connected to the source/drain region 58.

Figure 2R:
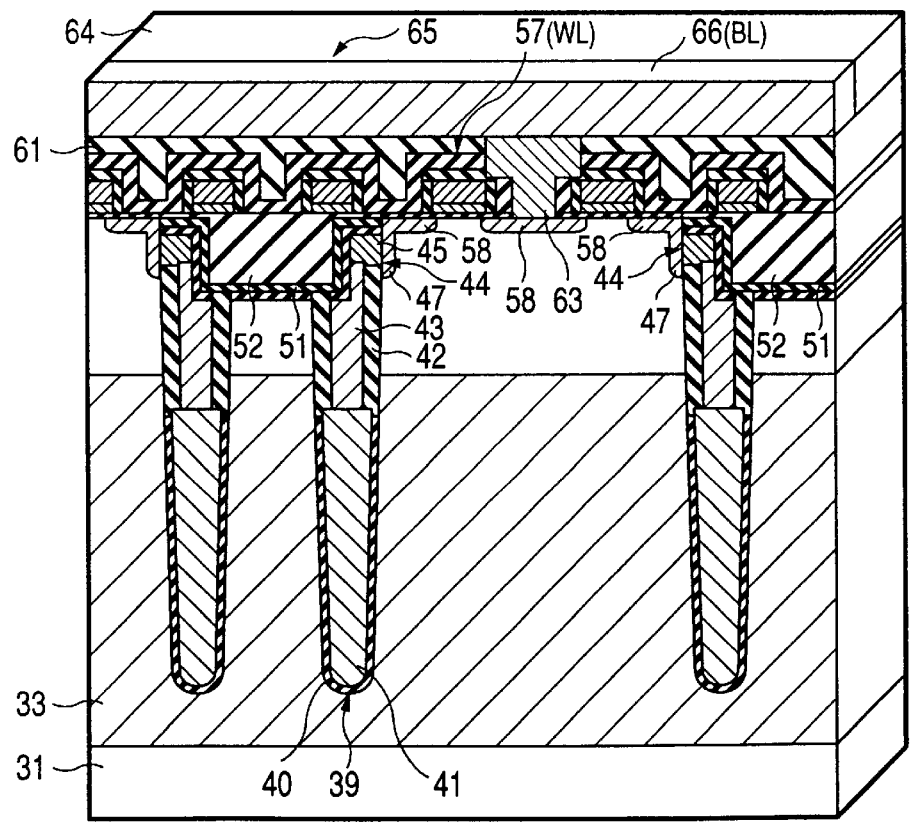

As shown in FIG. 2R, a second interlayer insulating film 64 is formed by depositing an insulating film such as BPSG on the first interlayer insulating film 61. Then, a photoresist film (not shown) is formed on the second interlayer insulating film 64 and patterned so as to have a groove corresponding to a bit line. The second interlayer insulating film 64 is selectively etched by RIE using the photoresist film mentioned above as a mask to form a groove 65 for buried wiring in the interlayer insulating film 64. Thereafter, a metal such as tungsten is deposited over the entire surface. The metal is removed successively from the surface by CMP so as to leave the metal in the groove 65, thereby forming metal wiring 66. The metal wiring 66 thus obtained is used as a bit line (BL).

In the method of manufacturing a DRAM, after the first TEOS film is deposited and then etched back by wet etching using a hydrofluoric acid solution to remove the seams and void generated during the first TEOS deposition step, and then second TEOS is deposited to form STI. It is therefore possible to bury the TEOS film in the trench without seams and void which inevitably appear in the conventional method. As a result, the planarization of the substrate is ensured. Furthermore, the polysilicon deposited during the word line formation step does not remain on the STI region. It is therefore possible to prevent electric short circuit between the gate electrodes (word lines).

It goes without saying that the present invention is not limited to the aforementioned embodiments and may be modified in various ways. In the aforementioned embodiments, the silicon oxide film (STI oxide film) 50 is formed on the inner wall of the shallow trench 49 and then the silicon nitride film (liner nitride film) 51 is formed over the entire surface to protect the trench inner wall. However, the silicon nitride film 51 is not necessary to form depending upon later manufacturing steps.

As explained in the foregoing, the present invention makes it possible to prevent seams and void from being generated in the insulating film when the trench is filled with the insulating film for device isolation. Hence, the present invention can provide a method of manufacturing a semiconductor device capable of improving the yield thereof.

Furthermore, the present invention makes it possible to prevent the seams and void from being generated in the insulating film buried in the device isolation trench. It is therefore possible to provide a method of manufacturing a semiconductor device capable of preventing electric short circuit between the gate electrodes, thereby preventing a decrease in the device yield.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming a trench in a semiconductor substrate;

depositing a first TEOS film in the trench, said first TEOS film having a seam in an interface thereof, by which the first TEOS film is closed at an upper portion, thereby forming a void in the first TEOS film;

etching back the first TEOS film by a wet etching method using hydrofluoric acid in such a way that an etching amount of the first TEOS film in an upper portion of the trench is larger than that in a bottom portion of the trench, so as to remove the seam and the void, thereby leaving the first TEOS film at bottom corner portions and on a side wall of the trench in the form of a two-stepped taper comprising a first stepped portion formed near a bottom of the trench and having a first angle with respect to a horizontal portion, and a second stepped portion formed above the first stepped portion and having a second angle with respect to the horizontal portion, said second angle being larger than the first angle; and depositing a second TEOS film in the trench, whereby the trench is completely filled with the second TEOS film.

2. A method of manufacturing a semiconductor device comprising the steps of:

forming a trench-type capacitor by forming a first trench in a semiconductor substrate;

forming a second trench in the semiconductor substrate, said second trench serving as device isolation and being shallower than the first trench;

depositing a first TEOS film in the second trench, said first TEOS film having a seam in an interface thereof, by which the first TEOS film is closed at an upper portion, thereby forming a void in the first TEOS film;

etching back the first TEOS film by a wet etching method using hydrofluoric acid in such a way that an etching amount of the first TEOS film in an upper portion of the second trench is larger than that in a bottom portion of the second trench, so as to remove the seam and the void, thereby leaving the first TEOS film at bottom corner portions and on a side wall of the second trench, in the form of a two-stepped taper comprising a first stepped portion formed near a bottom of he trench and having a first angle with respect to a horizontal portion, and a second stepped portion formed above the first stepped portion and having a second angle with respect to the horizontal portion, said second angle being larger than the first angle; and depositing a second TEOS film in the second trench, whereby the second trench is completely filled with the second TEOS film; and forming a transfer gate connected to the trench-type capacitor.

3. A method of manufacturing a semiconductor device comprising the steps of:

forming trench by etching a semiconductor substrate by RIE;

oxidizing the semiconductor substrate to remove damage by the etching;

depositing a silicon nitride film to protect an inner wall of the trench;

depositing a first TEOS film in the trench by a CVD method, said first TEOS film having a seam in an interface thereof, by which the first TEOS film is closed at an upper portion, thereby forming a void in the first TEOS film;

etching back the first TEOS film by a wet etching method using hydrofluoric acid in such a way that an etching amount of the, first TEOS film in an upper portion of the trench is larger than that in a bottom portion of the trench, so as to remove the seam and the void, thereby leaving the first TEOS film at bottom corner portion and on a side wall of the trench, in the form of a two-stepped taper comprising a first stepped portion formed near a bottom of the trench and having a first angle with respect to a horizontal portion, and a second stepped portion formed above the first stepped portion and having a second angle with respect to the horizontal portion, said second angle being larger than the first angle; and depositing a second TEOS film over an entire surface by a CVD method, whereby the trench is completely filled with the second TEOS film; and removing the second TEOS film by a CMP method to leave the second TEOS film only within the each.

4. A method of manufacturing a semiconductor device comprising the steps of:

forming a trench-type capacitor by forming a first trench in a semiconductor substrate;

etching the semiconductor substrate by RIE to form a second trench in the semiconductor substrate, said second trench serving as device insolation and being shallower than the first trench;

oxidizing the semiconductor substrate to remove damage by the etching;

depositing a silicon nitride film to protect an inner wall of the second trench;

depositing a first TEOS film in the second trench by a CVD method, said first TEOS film having a seam in an interface thereof, by which the first TEOS film is closed at an upper portion, thereby forming a void in the first TEOS film, etching back the first TEOS film by a wet-etching method using hydrofluoric acid in such a way that an etching amount of the first TEOS film in an upper portion of the second trench is larger than that in a bottom portion of the second trench; so as to remove the seam and the void, thereby leaving the first TEOS film at bottom corner portions and an a side wall of the second trench, in the form of a two-stepped taper comprising a first stepped portion formed near a bottom of the trench and having a first angle with respect to a horizontal portion, and a second stepped portion formed above the first stepped portion and having a second angle with respect to the horizontal portion, said second angle being larger than the first angle; and depositing a second TEOS film over an entire surface by a CVD method, whereby the second trench is completely filled with the second TEOS film;

removing the second TEOS film by a CMP method to leave the second TEOS film only within the second trench; and forming a transfer gate connected to trench-type capacitor.

* * * * *